(12) United States Patent
McHugh et al.

(10) Patent No.: US 6,269,535 B1
(45) Date of Patent: Aug. 7, 2001

(54) HANDLE TOOL USED FOR A ZIF SOCKET AND AN ASSEMBLY COMPRISING THE HANDLE TOOL AND THE ZIF SOCKET

(75) Inventors: Robert G. McHugh, Evergreen, CO (US); Nick Lin, Hsin-Chuang; Robert Yang, Tu-Chen, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/146,997

(22) Filed: Sep. 4, 1998

(51) Int. Cl.[7] .................................................. B23P 19/00
(52) U.S. Cl. ................... 29/764; 29/268; 29/270; 29/278; 29/762; 439/342
(58) Field of Search .......................... 29/240, 268, 221.5, 29/764, 762, 741, 277, 270, 261, 278, 283, 280; 339/45, 46; 439/342, 259, 263, 264, 268

(56) References Cited

U.S. PATENT DOCUMENTS

| | | | | |
|---|---|---|---|---|
| 4,012,097 | * | 3/1977 | Long et al. | 339/45 |
| 4,209,887 | * | 7/1980 | Saunders | 29/240 |
| 4,873,761 | * | 10/1989 | Korsunsky et al. | 29/741 |
| 5,007,465 | * | 4/1991 | Tonkiss | 140/150 |
| 5,707,247 | * | 1/1998 | Konstad | 439/342 |
| 5,772,451 | * | 6/1998 | Dozier, II et al. | 439/70 |
| 5,855,489 | * | 1/1999 | Walker | 439/342 |
| 5,893,770 | * | 4/1999 | Gober | 439/261 |
| 6,004,152 | * | 12/1999 | Walkup et al. | 439/342 |
| 6,059,596 | * | 5/2000 | Pei et al. | 439/342 |
| 6,099,321 | * | 8/2000 | McHugh et al. | 437/342 |
| 6,106,316 | * | 8/2000 | Barringer | 439/263 |
| 6,109,947 | * | 8/2000 | Lin | 439/342 |
| 6,115,909 | * | 9/2000 | Miller | 29/741 |
| 6,165,000 | * | 12/2000 | Haung | 439/342 |
| 6,203,350 | * | 3/2001 | Walkup et al. | 439/342 |

* cited by examiner

Primary Examiner—Lee Young
Assistant Examiner—Sean Smith
(74) Attorney, Agent, or Firm—Wei Te Chung

(57) ABSTRACT

A scissors-like handle tool manipulates a ZIF socket having a cover slidably engaged with a bottom, between a loosened status and a tightened status. The handle tool comprises a first lever arm pivotably connected to a second lever arm. The handle tool is operated by encountering two lower ends of the first and second lever arms with two movable sides of the socket via a pivot operation of the handle tool thereby moving the cover of the ZIF socket along the bottom.

6 Claims, 9 Drawing Sheets

US 6,269,535 B1

HANDLE TOOL USED FOR A ZIF SOCKET AND AN ASSEMBLY COMPRISING THE HANDLE TOOL AND THE ZIF SOCKET

BACKGROUND OF THE INVENTION

1. Field of The Invention

The present invention relates to a handle tool used for a ZIF socket and an assembly comprising the handle tool and the ZIF socket, and especially to a handle tool which is suitable to manipulate a ZIF socket between a tightened status or a released status.

2. The Prior Art

Conventional ZIF sockets are usually installed with an actuation mechanism including a cam and a handle connected to the cam for controlling the cam to rotate clockwise or counterclockwise so as to manipulate the ZIF socket between a loosened status and a tightened status for assisting in the mounting of a CPU chip thereon. However, the actuation mechanism occupies too much space on the ZIF socket. Therefore, it is requisite to provide a new tool which can manipulate the status of the ZIF socket and conserve space thereon.

SUMMARY OF THE INVENTION

The primary purpose of the present invention is to provide a handle tool which decreases the thickness of a ZIF socket.

A second purpose of the present invention is to provide a handle tool for conveniently operating a ZIF socket between a loosened status and a tightened status.

In accordance with one aspect of the present invention, a handle tool is used with a ZIF socket which has a square cover matingly fixed on a bottom. The cover has a first diagonal line coplanar with a second diagonal line of the bottom. Both the first diagonal line and the second diagonal line are defined in respective surfaces of the cover and the bottom parallel to each other. The coplane of the first diagonal line and the second diagonal line is a virtual plane perpendicular to both surfaces of the cover and the bottom. The cover has a longer diagonal length than the diagonal length of the bottom, and is slidable with respect to the bottom along the second diagonal line. The handle tool comprises a scissors mechanism including a first lever arm pivotably connected to a second lever arm. The first lever arm defines a hole near a free end thereof for extension of a corner of the cover when an opposite corner of the cover is driven by a corresponding free end of the second lever arm upon a pivotable movement of the scissors mechanism.

In accordance with a second aspect of the present invention, a handle tool used for a ZIF socket having a cover slidably fixed on a bottom wherein the cover has two protrusions projecting from two opposite sides thereof. The cover is slidable over the bottom along a line defined between the two protrusions. The handle tool comprises a scissors mechanism including a first lever arm pivotably connected to a second lever arm. The first lever arm defines a hole near a free end thereof for extension of one of the protrusions of the cover therethrough when the opposite protrusion is driven by a corresponding free end of the second lever arm upon a pivotable movement of the scissors mechanism.

In accordance with a third aspect of the present invention, a handle tool comprises a scissors mechanism including a first lever arm pivotably connected to a second lever arm. The first lever arm defines a hole near a lower free end thereof for extension of a portion of a cover of a ZIF socket therethrough which is slidably mounted on a corresponding bottom of the ZIF socket when the scissors mechanism is operated to cause the lower end of the first lever arm and a confronting lower free end of the second lever arm to move toward each other thereby moving the cover along the bottom of the ZIF socket.

In accordance with a fourth aspect of the present invention, a handle tool comprises a scissors mechanism including a first lever arm pivotably connected to a second lever arm. The second lever arm forms a protrusion near a lower free end thereof for encountering a portion of a bottom of a ZIF socket on which a cover sized to be greater than the bottom is slidably mounted. The scissors mechanism is operated to cause the lower end of the first lever arm and the corresponding protrusion of the lower free end of the second lever arm to move toward each other thereby moving the cover along the bottom of the ZIF socket.

In accordance with a fifth aspect of the present invention, a handle tool comprises a scissors mechanism including a first lever arm pivotably connected to a second lever arm. The first and second lever arms respectively form first and second protrusions near a lower end thereof for respectively encountering a cover and a bottom of a ZIF socket which are slidably engaged. The scissors mechanism is operated to cause the first and second protrusions to move toward each other thereby moving the cover along the bottom of the ZIF socket.

These and additional objects, features and advantages of the present invention will become apparent after reading the following detailed description of the preferred embodiments of the invention taken in conjunction with the appended drawing figures.

DETAILED DESCRIPTION OF THE PREFERRED EMBODIMENTS

Figure 1:
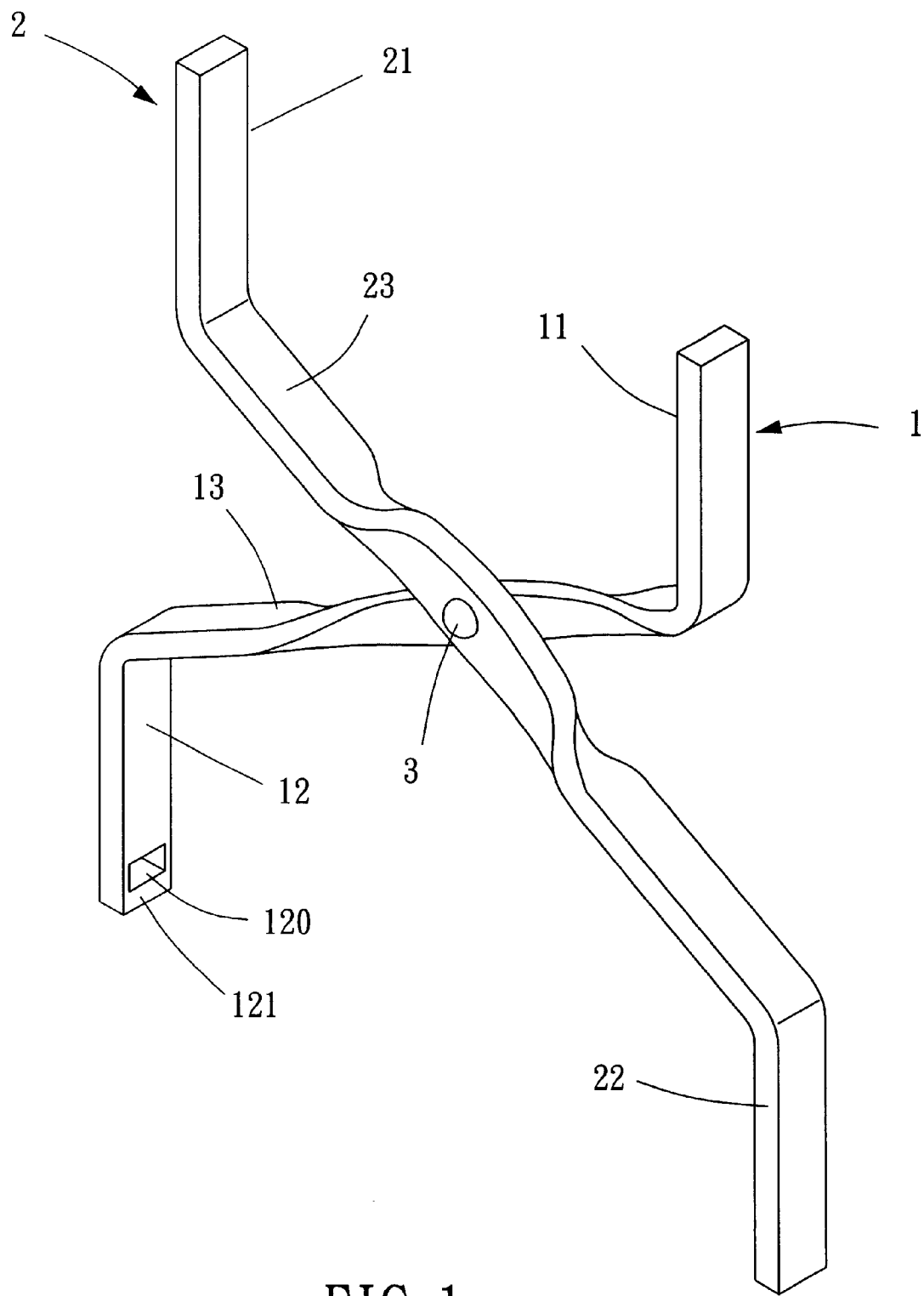
FIG. 1 is a perspective view of a handle tool for a ZIF socket in accordance with the present invention.

Referring to FIG. 1, a handle tool for a ZIF socket in accordance with the present invention comprises a first lever arm 1 pivotably connected to a second lever arm 2 via a rivet 3 thereby constituting a scissors mechanism. The first lever arm 1 and the second lever arm 2 are each bent in opposite directions at two intermediate points thereof thus forming a holding portion 11, 21, an intermediate portion 13, 23, and a driving portion 12, 22. The driving portion 12 of the first lever arm 1 defines a hole 120 thereby forming an edge 121 between the hole 120 and a free end of the driving portion 12.

Figure 2A:
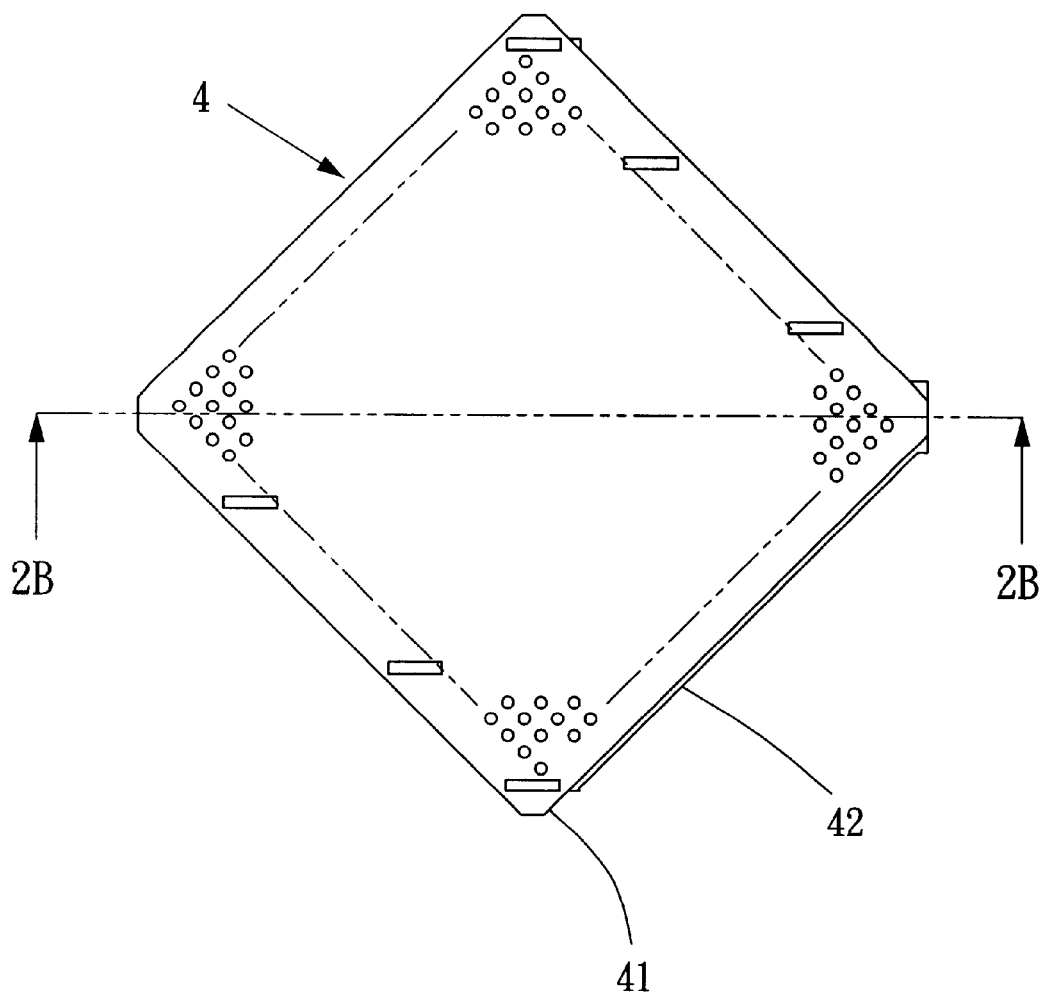
FIG. 2A is top view of a ZIF socket.
Figure 2B:
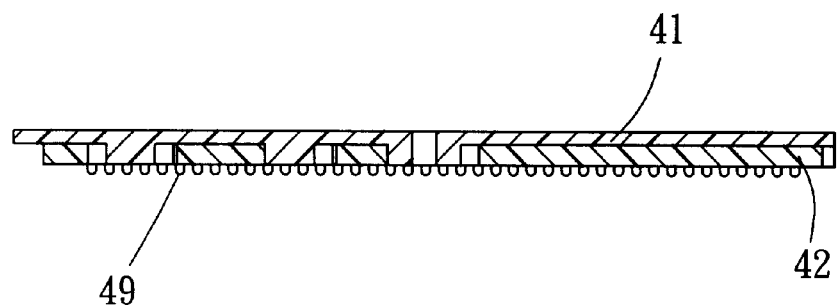
FIG. 2B is a cross-sectional view taken along line 2B—2B of FIG. 2A.

Referring to FIGS. 2A and 2B, a ZIF socket 4 comprises a cover 41 slidably mounted on a bottom 42. Specifically, the cover 41 is slidable along a diagonal line of the bottom 42. The cover 41 has a longer diagonal length than the bottom 42.

Figure 3:
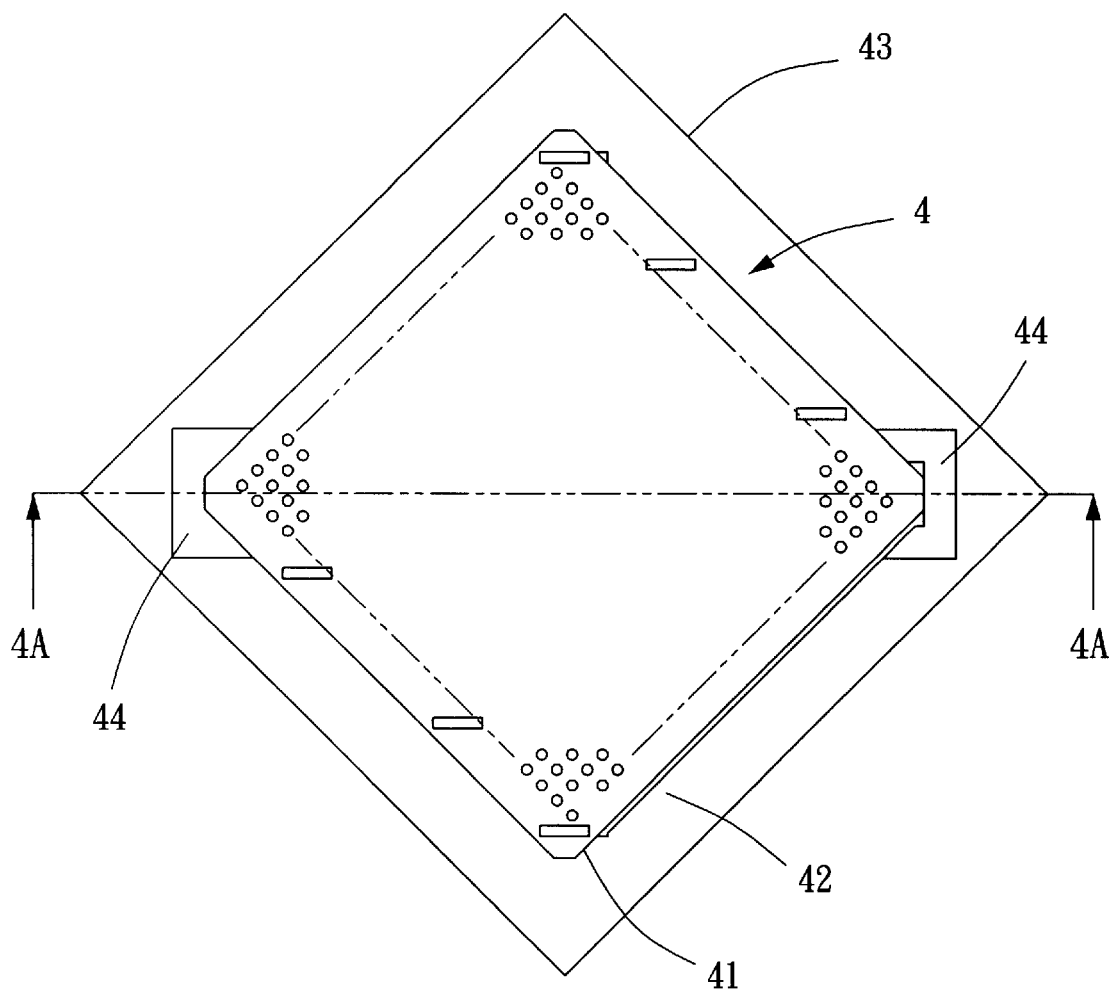
FIG. 3 is top view of the ZIF socket of FIG. 2A received in a metal frame.

Referring to FIG. 3, the ZIF socket 4 is received in a metal frame 43 which defines a recess 44 substantially accommodating the outline of the socket 4 with two additional spaces extending from two diagonal corners of the recess 44 for providing operational space when the socket 4 is manipulated between a loosened status and a tightened status.

Figure 4A:
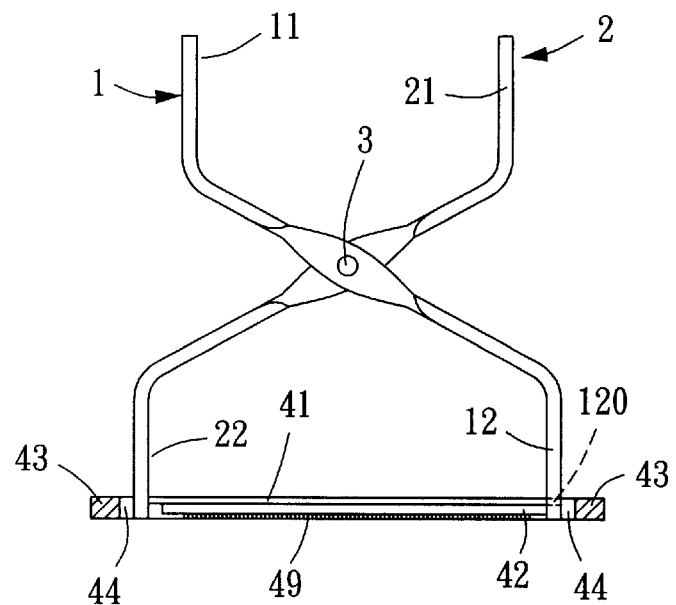
FIG. 4A is a cross sectional view taken along line 4A—4A of FIG. 3 wherein the handle tool of FIG. 1 is operated and the cover of the ZIF socket is moved relative to the bottom along a diagonal line thereof.
Figure 4B:
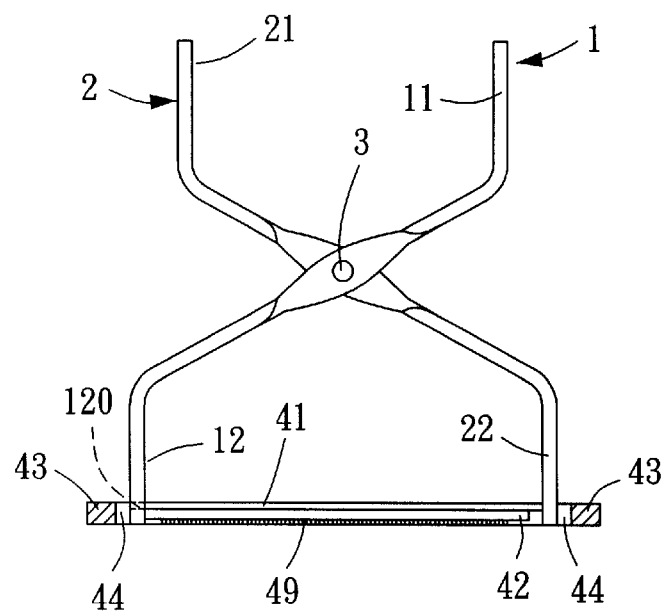
FIG. 4B is similar to FIG. 4A except that the handle tool is rotated 180 degrees to return the cover to the location shown in FIG. 3.

Referring to FIG. 4A, the handle tool can move the cover 41 of the socket relative to the bottom 42 by placing the driving portions 12, 22 of the two lever arms 1, 2 in the additional diagonal spaces of the recess 44. In this figure, solder balls 49 extend from a bottom face of the socket for soldering on a printed circuit board. The driving portion 22 of the second lever arm 2 encounters the extending portion of the cover 41 with respect to the bottom 42. Therefore, when the scissors structure of the handle tool is operated causing the two driving portions 22, 12 to move toward each other, the cover 41 will move along the bottom 42 and a portion of the cover 41 will extend into the hole 120 of the driving portion 12 of the first lever arm 1. Subsequently, to return the cover 41 to its original location, the handle tool is rotated 180 degrees as shown in FIG. 4B. In this situation, the hole 120 receives a diagonal corner portion of the cover 41. Additionally, the edge 121 of the driving portion 12 below the hole 120 should have a height less than the thickness of the bottom 42, otherwise the edge 121 will block the cover 41 and prohibit movement thereof along the bottom 42.

Figure 5:
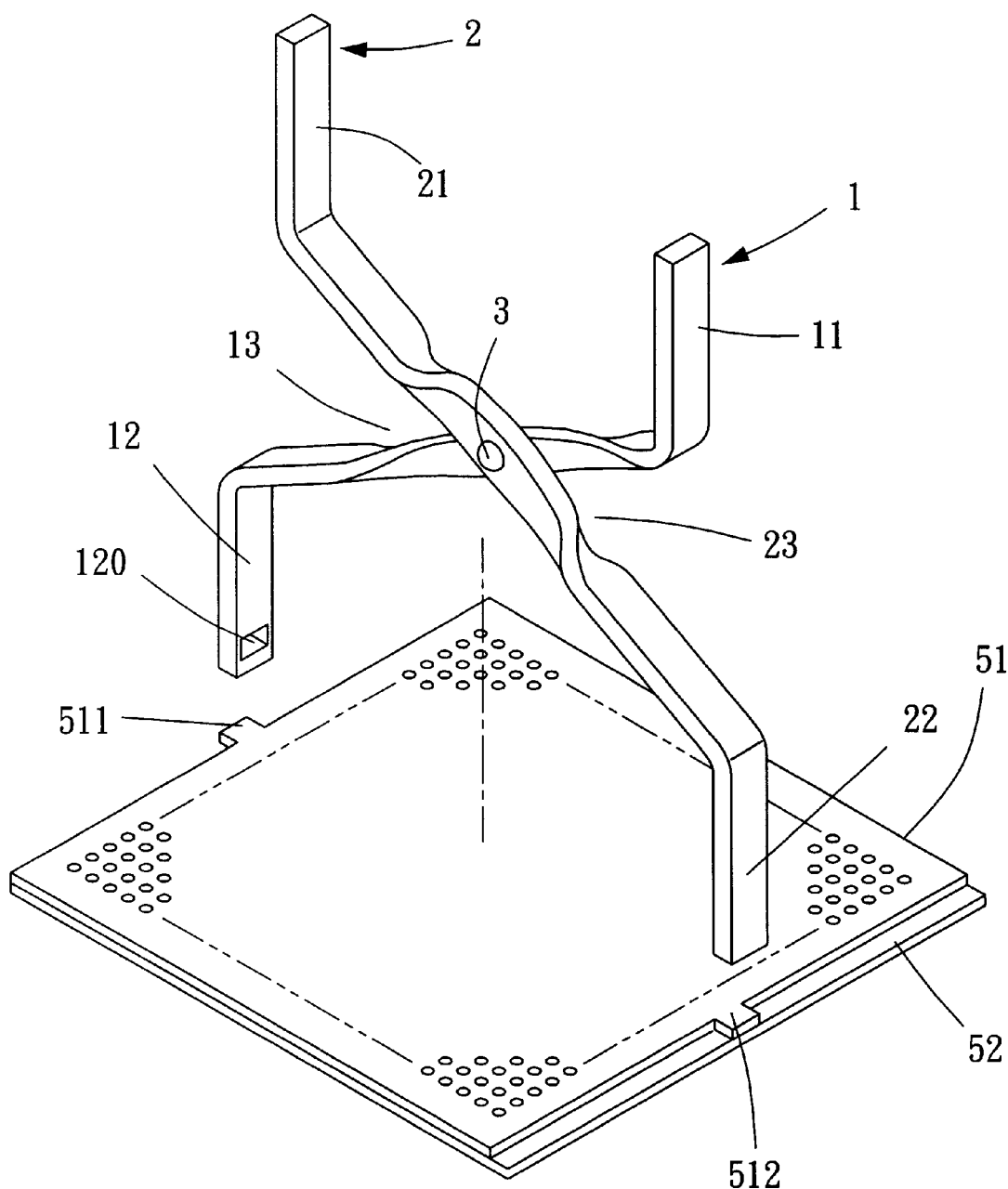
FIG. 5 is a perspective view of another ZIF socket and the handle tool of FIG. 1.

The handle tool may be used with other kinds of sockets. FIG. 5 illustrates a ZIF socket which has a cover 51 slidably fixed on a bottom 52 wherein the cover 51 has two protrusions 511, 512 projecting from two opposite sides thereof and the cover 51 can slide over the bottom 52 along a line defined between the two protrusions 511, 512 which is parallel to opposite sides of the bottom 52. The socket of FIG. 5 is positioned in a frame (closure) similar to the one shown in FIG. 3, except that the additional space of the recess 44 is formed in the opposite intermediate portions of the recess 44 in order to conform to the shape of the socket.

Figure 6:
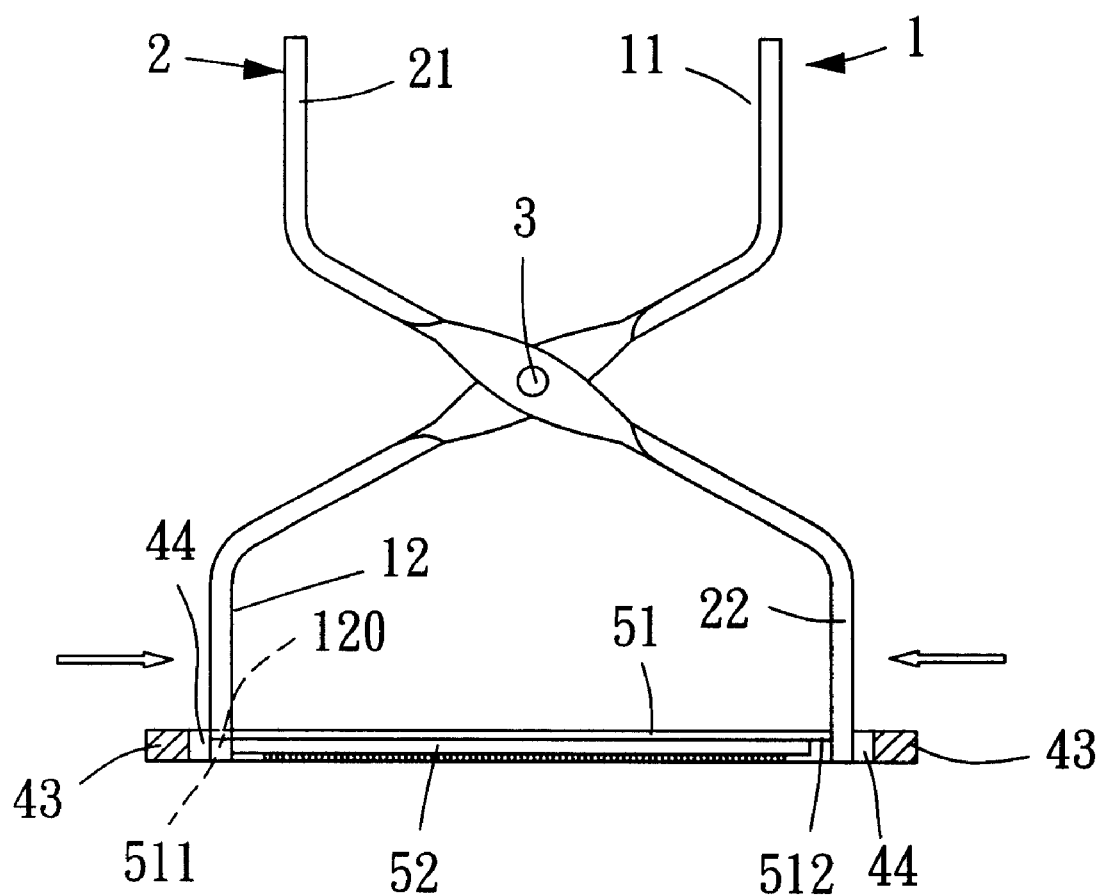
FIG. 6 is a schematic side view when the handle of FIG. 5 is operates on the socket which is received in a metal frame similar to that of FIG. 3.

Referring to FIG. 6, the two protrusions 511, 512 are so sized that each of them can be respectively received in the hole 120 of the handle tool during opposite movements of the cover 51 (i.e., loosened status or tightened status) with respect to the bottom 52. The distance between the two protrusions 511, 512 must be greater than the corresponding length of the bottom 52 for the cover 51 to be operated by the handle tool to move along the bottom 52.

Figure 7:
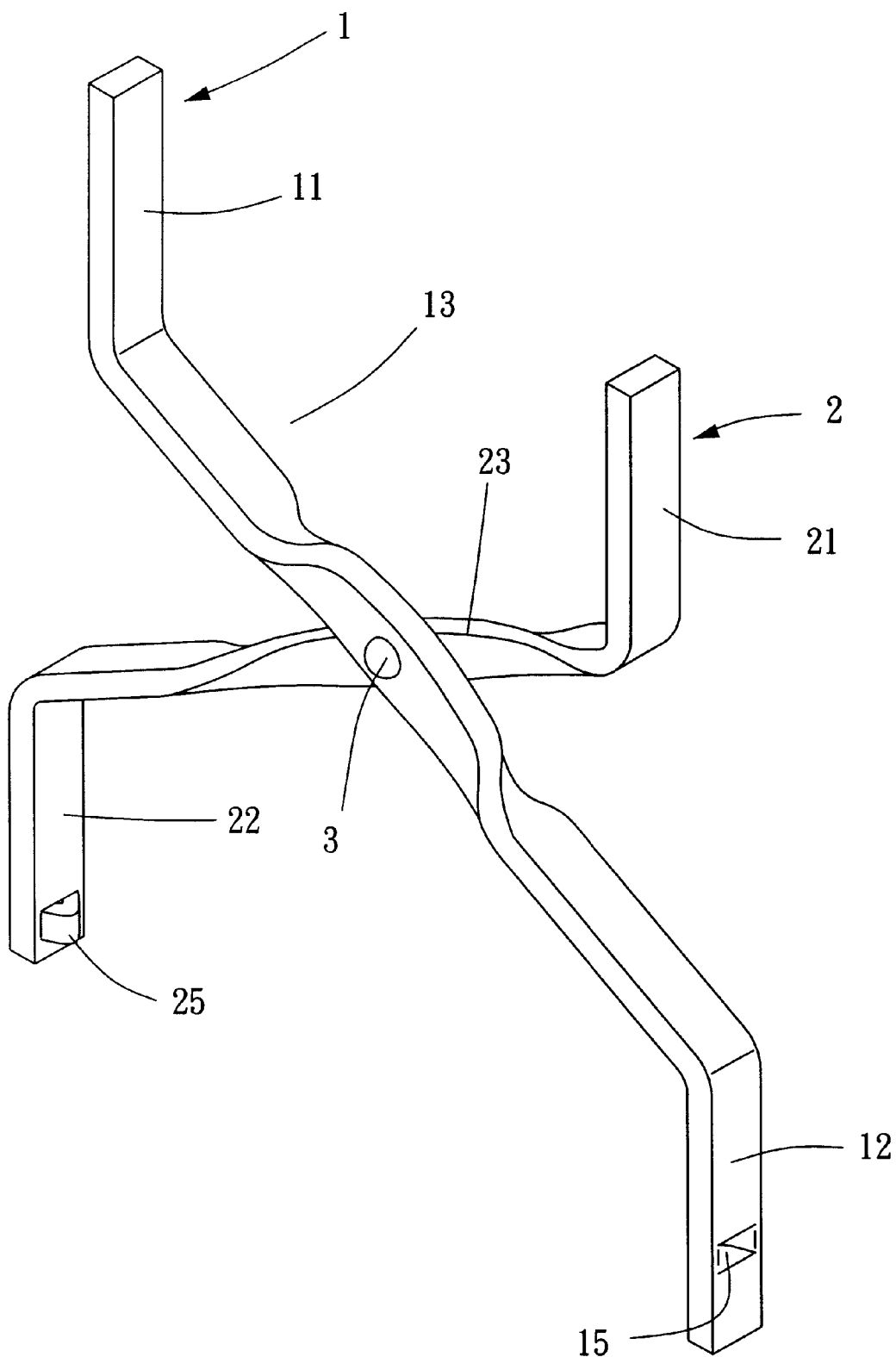
FIG. 7 is a perspective view of a second embodiment of the handle tool in accordance with the present invention.

FIG. 7 illustrates a second embodiment of the handle tool in accordance with the present invention. The handle tool is similar to that of the first embodiment except for the driving portions 12, 22. First and second protrusion portions 15, 25 which may be tabs formed by stamping, are respectively formed on the driving portions 12, 22 of the first and second lever arms 1, 2. The vertical locations of the first and second protrusion portions 15, 25 respectively encounter the cover and the bottom. The handle tool may be used for the ZIF sockets shown in FIGS. 3 and 5 but it is particularly suitable for a ZIF socket which has a cover and bottom of substantially identical length.

Figure 8:
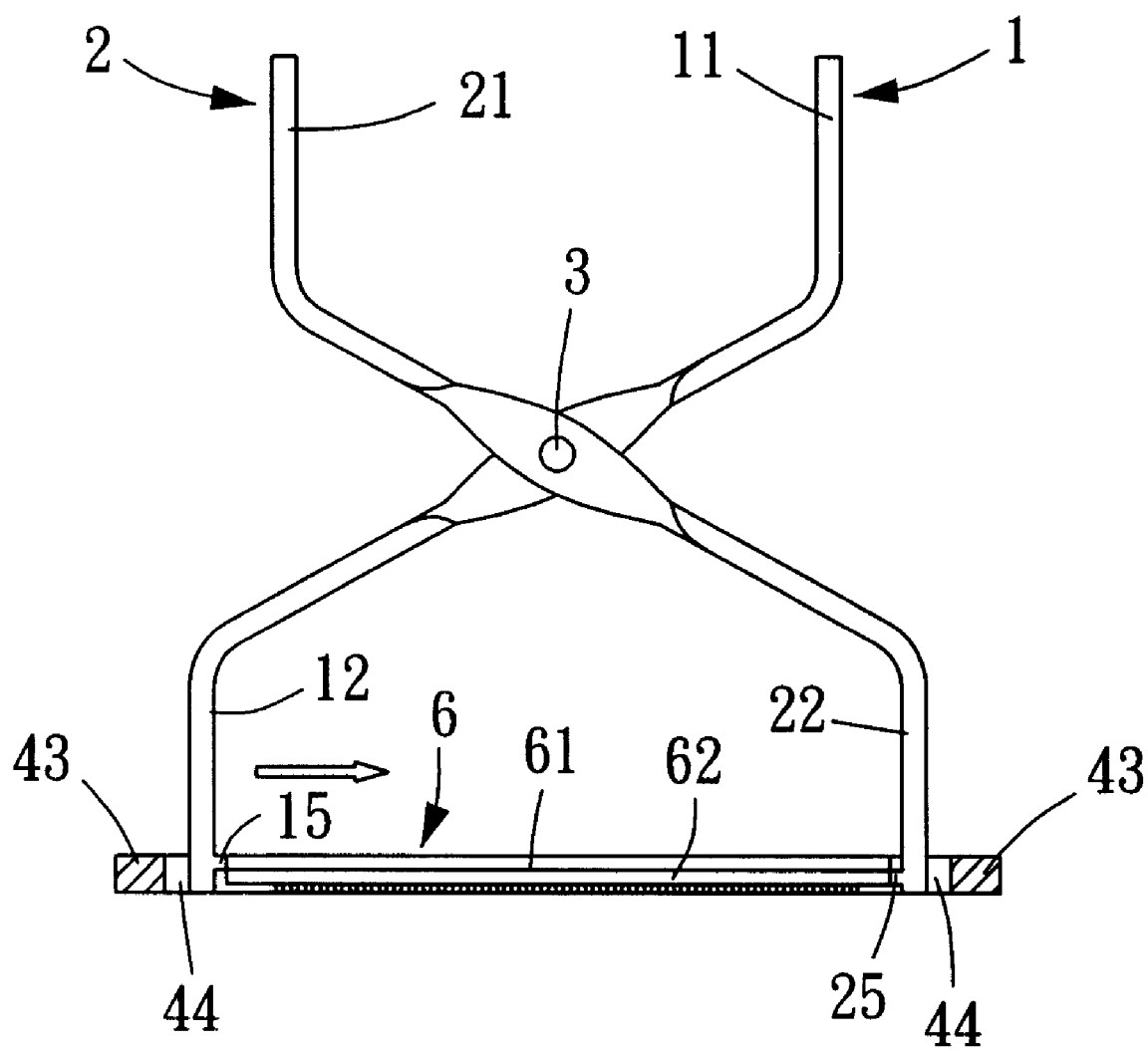
FIG. 8 is a cross-sectional view of the ZIF socket being operated on by the handle tool of FIG. 7.
Figure 9:
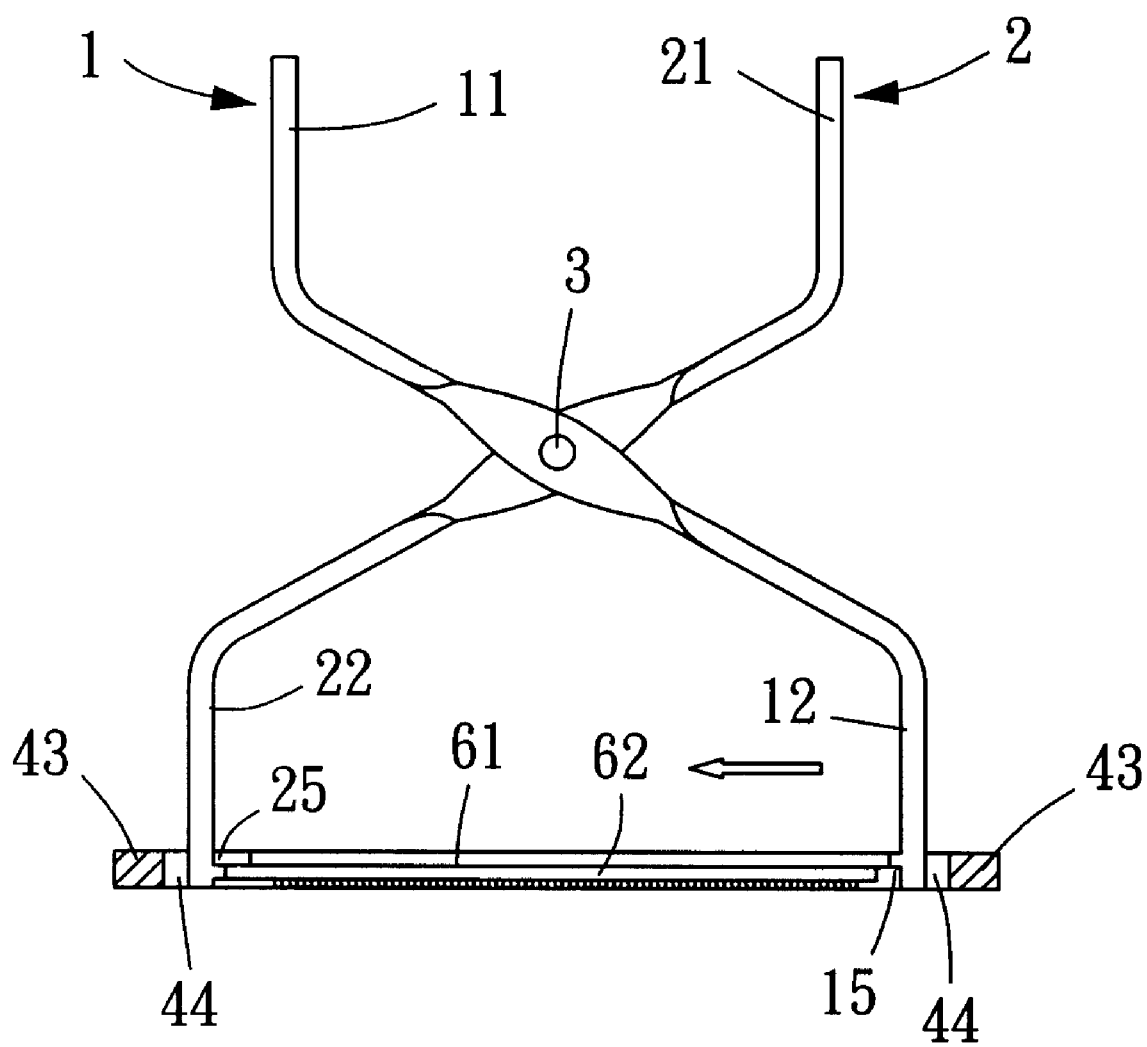
FIG. 9 is similar to FIG. 8 except that the handle tool is rotated 180 degrees for returning the cover to its original location.

Referring to FIG. 8, another kind of ZIF socket 6 including a cover 61 slidable along a bottom 62, is operated by the handle tool of FIG. 7. The cover 61 and the bottom 62 are substantially the same length in the direction of movement. The first protrusion portion 15 of the first lever arm 1 and the second protrusion portion 25 of the second lever arm 2 respectively encounter the cover 61 and the bottom 62. During operation, the cover 61 and the bottom 62 respectively receive a force from the two protrusions 15, 25, thus the cover 61 moves over the bottom 62 along a direction as indicated by an arrow. To return the cover 61 back to its original position as shown in FIG. 9, the handle tool is rotated 180 degrees and operated again.

While the present invention has been described with reference to specific embodiments, the description is illustrative of the invention and is not to be construed as limiting the invention.

Therefore, various modifications to the present invention can be made to the preferred embodiments by those skilled in the art without departing from the true spirit and scope of the invention as defined by the appended claims.

What is claimed is:

1. A combination comprising a handle tool with a scissors mechanism including a first lever arm pivotably connected to a second lever arm, the first lever arm defining a hole near a lower free end thereof which receives a portion of a cover of a ZIF socket therethrough which is horizontally slidably mounted on a corresponding bottom of the ZIF socket when the scissors mechanism is operated to cause the lower end of the first lever arm and a confronting lower free end of the second lever arm to move toward each other thereby moving the cover horizontally along the bottom of the ZIF socket.

2. A combination comprising a handle tool with a scissors mechanism including a first lever arm pivotably connected to a second lever arm, the second lever arm having a protrusion near a lower free end thereof and encountering a portion of a bottom of a ZIF socket on which a cover sized to be greater than the bottom is horizontally slidably mounted, wherein the scissors mechanism is operated to cause the lower end of the first lever arm and the corresponding protrusion of the lower free end of the second lever arm to move toward each other thereby horizontally moving the cover along the bottom of the ZIF socket.

3. A method for actuating a socket wherein said socket includes a bottom and a cover adapted to slidably move with regard to the bottom, the steps comprising:

provinding a handle tool of a scissors mechanism including a first lever arm pivotably connected to a second lever arm wherein at least one lever arm includes means for engagement with at least one of said cover and said bottom;

operating the tool in a manner that a first plane defined by both of the first lever arm and the second lever arm is perpendicular to a second plane defined by either the cover or the bottom, and having lower ends of the first lever arm and of the second lever arm move close to each other so as to have the cover move with regard to the bottom in a first direction parallel to the second plane wherein the first lever arm confronts a first edge of the bottom and the second lever arm confronts a second edge of the bottom opposite to the first edge so that the socket is in a released status; and oppositely operating the tool in a reversed manner and having the lower ends of the first lever arm and of the second lever arm close to each other so as to have the cover move with regard to the bottom in a second direction parallel to the second plane and opposite to the first direction wherein the first lever arm confronts the second edge of the bottom and the second lever arm confronts the first edge of the bottom so that the socket is in a tightened status.

4. The method as claimed in claim 3, wherein said means is a hole for engagement with protrusions on the cover.

5. The method as claimed in claim 3, wherein said means is a protrusion for engagement with either the cover or the bottom.

6. The method as claimed in claim 3, wherein said means includes two protrusions at two different levels for respective engagement with the cover and the bottom.

\* \* \* \* \*